United States Patent
Nakagawa et al.

(10) Patent No.: US 6,234,298 B1
(45) Date of Patent: May 22, 2001

(54) FEEDER FOR ELECTRONIC CHIP COMPONENTS

(75) Inventors: Kiyoyuki Nakagawa, Takefu; Kenichi Fukuda, Sabae; Isamu Utsunomiya, Shiga-ken, all of (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/271,320

(22) Filed: Mar. 18, 1999

(30) Foreign Application Priority Data

Mar. 27, 1998 (JP) .................................................. 10-080819

(51) Int. Cl.⁷ .................................................. B65G 47/44
(52) U.S. Cl. .................................................. 198/396
(58) Field of Search .................................... 198/383, 392, 198/396, 409, 443, 533

(56) References Cited

U.S. PATENT DOCUMENTS 3,417,856 * 12/1968 O'Brien et al. ...................... 198/396
5,636,725 * 6/1997 Saito et al. ........................ 198/443 X
5,836,437 * 11/1998 Saito et al. ............................ 198/396

* cited by examiner

Primary Examiner—James R. Bidwell
(74) Attorney, Agent, or Firm—Burns, Doane, Swecker & Mathis, LLP

(57) ABSTRACT

A feeder for electronic chip components is provided having an aligning path forming member agitating electronic chip components which are to be discharged from a discharge opening of a hopper for accommodating a plurality of electronic chip components. The agitation is achieved by reciprocating the aligning path forming member in the axis direction of the discharge opening and forming a tubular aligning path which receives only the electronic chip components aligned in a predetermined direction therein. When the aligning path forming member reciprocates it also rotates around its axis. This results in an increased agitating effect on electronic chip components for guiding them into the aligning path.

21 Claims, 4 Drawing Sheets

FEEDER FOR ELECTRONIC CHIP COMPONENTS

This application corresponds to Japanese Patent Application No. 10-80819, filed on Mar. 27, 1998, which is hereby incorporated by reference in its entirety.

BACKGROUND

1. Field of the Invention

The present invention relates to a feeder for feeding electronic chip components, and more specifically to a feeder for feeding a plurality of randomly oriented electronic chip components in an aligned state.

2. Description of the Related Art

In order to feed electronic chip components such as capacitors, resistors, transistors, and filters, a plurality of randomly oriented electronic chip components are dispensed in an aligned state one by one by a feeder.

FIG. 6 schematically illustrates a related feeder 1 for electronic chip components. The feeder 1 for feeding electronic chip components includes a pooling section 2, an aligning section 3, a conveying section 4, and a dispensing section 5, as respective functional sections.

The pooling section 2 is formed of a hopper 7 for pooling a plurality of randomly oriented electronic chip components 6 (shown in aggregation). A discharge opening 8 is formed in the bottom portion of the hopper 7. The above-mentioned aligning section 3 is arranged in association with this discharge opening 8.

FIG. 7 is a perspective cut-away view illustrating the aligning section 3. As indicated there, an aligning path forming member 10 is formed in the aligning section 3, forming a tubular aligning path 9. The aligning path forming member 10 is placed inside of the discharge opening 8. The aligning path forming member 10 reciprocates in the axis direction of the discharge opening 8 as shown by a predetermined stroke range 11. This movement is provided by a driving mechanism 30. The broken line indicates an upper bound of the stroke range 11. Because of this movement, the aligning path forming member 10 acts on electronic chip components 6, which are to be discharged from the discharge opening 8, so as to agitate them. Only the electronic chip components 6 which have become oriented in the predetermined aligning direction by this agitation pass into the tubular aligning path 9.

In the aligning section 3 shown in FIG. 7, in order to enable electronic chip components 6 of small size to be fed, a fixed pipe 12 for guiding electronic chip components 6 in an aligned state is further formed within the tubular aligning path 9 of the aligning path forming member 10. The inner diameter of the fixed pipe 12 is selected so as to be able to receive an electronic chip component 6 only when the longitudinal direction of the electronic chip component 6 substantially agrees with the axis direction of the fixed pipe 12.

In this manner, the aligning path forming member 10 agitates electronic chip components 6, which are to be discharged from the discharge opening 8, by its reciprocating movement so as to smoothly move electronic components 6 in the hopper 7 and to guide them to the aligning path 9 or the fixed pipe 12 as well. In order to more smoothly guide electronic chip components 6 to the aligning path 9 or the fixed pipe 12, an inverse conical-shaped concave surface is formed on an end face 13, located within the hopper 7, of the aligning path forming member 10.

Referring again to FIG. 6, the electronic chip components 6 passed through the aligning path forming member 10, or more specifically, through the fixed pipe 12, will advance to the conveying section 4. In the conveying section 4, a conveying path 14 such as a conveyor belt (not shown) is formed. The conveying path 14 is used for conveying the electronic chip components 6 passed through the fixed pipe 12 in an aligned state.

At the end of the conveying path 14, the above-mentioned dispensing section 5 is formed. In the dispensing section 5, a dispensing mechanism (not shown) for dispensing electronic chip components 6 is disposed. A picking-up apparatus for picking up electronic chip components 6 (such as a vacuum chuck) can be used for the dispensing mechanism.

As described above, since the aligning path forming member 10 agitates electronic chip components 6 by its reciprocating movement so as to guide them to the aligning path 9 or the fixed pipe 12, one or more electronic chip components 6 must be ideally guided into the fixed pipe 12 every cycle of the reciprocating movement of the aligning path forming member 10 without any discontinuance.

However, while the aligning path forming member 10 repeats the reciprocating movements, there are some occurrences in which electronic chip components 6 are not guided into the aligning path 9 or the fixed pipe 12. These occurrences are more likely when a comparatively large number of electronic chip components 6 remain in the hopper 7. One reason for these occurrences may be that the agitation movement by the aligning path forming member 10 does not sufficiently act on (e.g., agitate) the electronic chip components 6.

In order to solve the above-mentioned problem, the stroke 11 of the reciprocating movement of the aligning path forming member 10 is increased to obtain harder agitating action. However, when the stroke 11 of the aligning path forming member 10 is increased in this way, the following problems may occur.

First, since an impact on the electronic chip components 6 by the aligning path forming member 10 is increased, electronic chip components 6 may be damaged, reducing the quality of electronic chip components 6.

Next, when a cycle per unit time is maintained while the stroke 11 of the aligning path forming member 10 is increased, it is necessary to increase the driving speed of the aligning path forming member 10. This causes an increase in the load to the mechanism 30 for driving the aligning path forming member 10. This can result in disadvantages such as a breakdown of the mechanism, a reduced life of the mechanism, and/or frequent maintenance of the mechanism.

Also, if the stroke 11 of the aligning path forming member 10 is increased, when a small number of electronic chip components 6 remain in the hopper 7, the electronic chip components 6 "jump" in the hopper 7. This may prevent the components 6 from smoothly entering into the aligning path 9 or the fixed pipe 12.

SUMMARY

Accordingly, it is an object of the present invention to provide a feeder for electronic chip components which solves or reduces at least the above-mentioned problems.

A feeder for electronic chip components according to the present invention comprises a hopper for accommodating a plurality of electronic chip components, having a discharge opening in the bottom portion thereof. The feeder also includes an aligning path forming member placed in the discharge opening for agitating electronic chip components which are to be discharged from the discharge opening by reciprocating movement of the aligning path forming member in the axis direction of the discharge opening. The aligning path forming member forms a tubular aligning path which receives only the electronic chip components aligned in a predetermined direction therein. The feeder also includes a conveying path for conveying the electronic chip components which have passed through the aligning path forming member in an aligned state, and a dispensing mechanism for dispensing electronic chip components from the end portion of the conveying path. In addition to the reciprocation, the aligning path forming member is driven so as to be rotated around the axis thereof in order to reduce the above-mentioned technological problems.

The feeder according to the present invention may further comprise a fixed pipe for guiding electronic chip components in an aligned state within the tubular aligning path of the aforementioned aligning path forming member.

The aligning path forming member can be coupled to the feeder such that its rotation movement is tied to its reciprocation movement (e.g, such that one type of movement causes the other type of movement). For example, the aligning path forming member may be rotated when it is advanced so as to protrude into the hopper. Alternatively, the aligning path forming member may be rotated when withdrawing it from the hopper. The aligning path forming member may also be rotated both when it is advanced into and withdrawn from the hopper. It is also possible to continuously rotate the aligning path forming member.

In the feeder according to the present invention, it is preferable that an inverse conical-shaped concave surface be formed on an end face of the aligning path forming member located within the hopper.

In the feeder according to the present invention, it is preferable that a protrusion or a guide vane be formed on an end face of the aligning path forming member located within the hopper.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENTS

Figure 1:
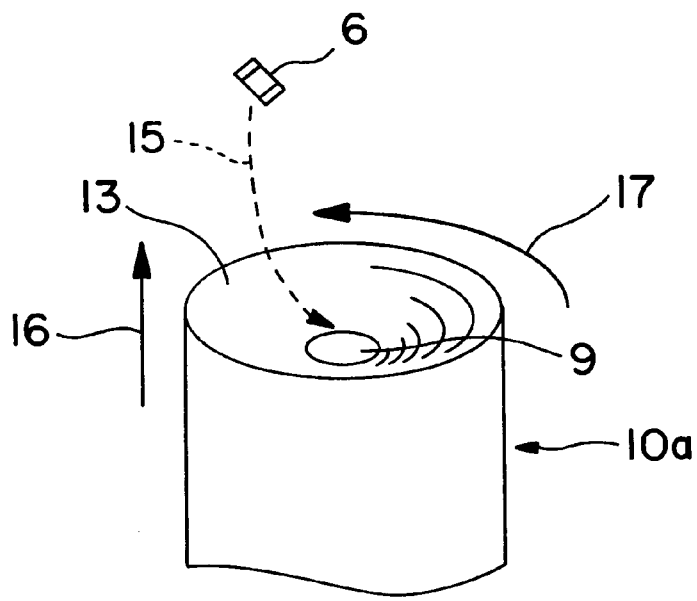
FIG. 1 is a perspective view illustrating a principal part of an aligning path forming member 10a formed in a feeder for feeding electronic chip components according to a first embodiment of the present invention.

FIG. 1 is an enlarged perspective view for illustrating a part corresponding to the aligning path forming member 10 described with reference to FIG. 7, in a feeder for feeding electronic chip components according to a first embodiment of the present invention.

The feeder for electronic chip components according to this embodiment has some similar features to the aforementioned feeder for electronic chip components 1 described with reference to FIGS. 6 and 7. Therefore, features specific to the identified first embodiment will be emphasized. Features which are similar to those identified in FIGS. 6 and 7 are given like reference numerals and a more detailed description thereof is omitted.

Figure 6:
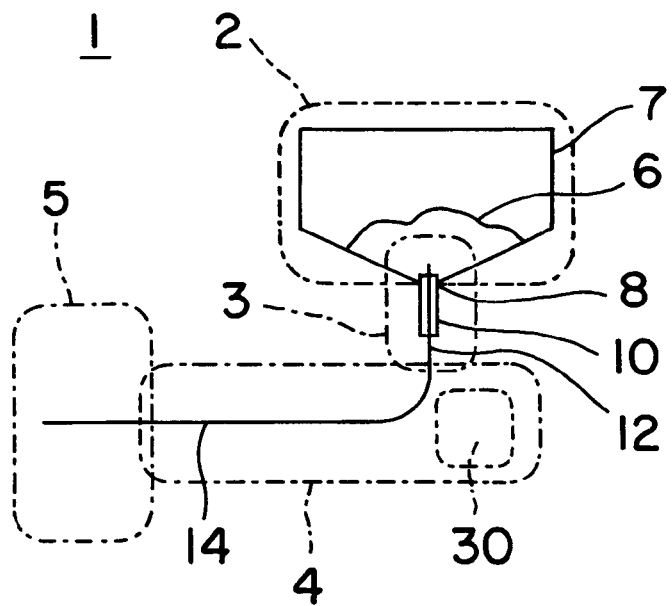
FIG. 6 is a diagram of a front view illustrating a schematic configuration of a feeder 1 for feeding electronic chip components.
Figure 7:
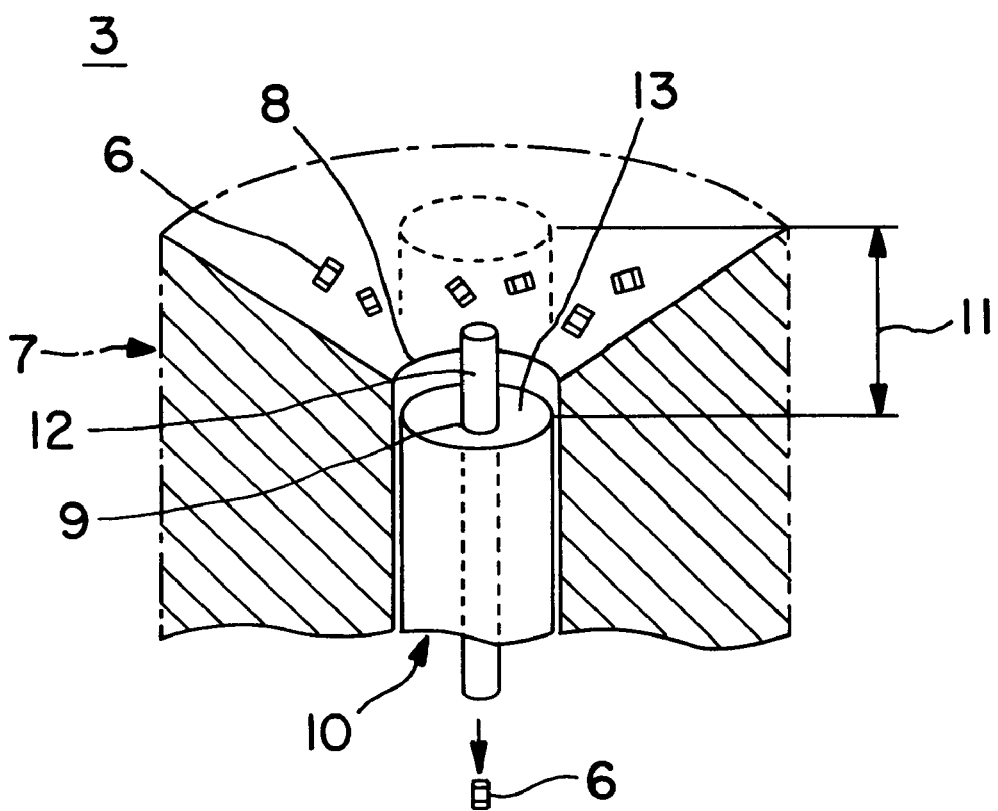
FIG. 7 is a perspective cut-away view illustrating an aligning section 3 shown in FIG. 6.

Referring to FIG. 1, as described above, an aligning path forming member 10a is placed inside of a discharge opening 8 of a hopper 7 (see FIGS. 6 and 7). This assembly agitates the electronic chip components 6, which are to be discharged from the discharge opening 8, by reciprocating in the axis direction of the discharge opening 8. This assembly also simultaneously forms a tubular aligning path 9 which receives only the electronic chip components 6 aligned in a predetermined direction, e.g., such as shown by a broken-line arrow 15. An inverse conical-shaped concave surface is formed on the end face 13 of the aligning path forming member 10a located within the hopper 7.

The aligning path forming member 10a which reciprocates in the manner described above is driven so as to be rotated around its axis direction as shown by an arrow 17 when protruding into the hopper 7 in the direction as shown by an arrow 16 in its reciprocating movement. The moving force can be provided by the driving mechanism 30 shown in FIG. 6 (which, as well known, can comprise a motor having a rotating shaft connected to the aligning path forming member 10a via, e.g., a gearing assembly or like mechanism).

In this embodiment, since the aligning path forming member 10a is rotated when protruding into the hopper 7, more powerful agitation can be applied to the electronic chip components 6 to more smoothly guide them into the aligning path 9. In this embodiment, the above-described movement is especially effective for releasing electronic chip components 6 grouped in a cluster located above the aligning path. forming member 10a (in the direction of the arrow 16).

Figure 2:
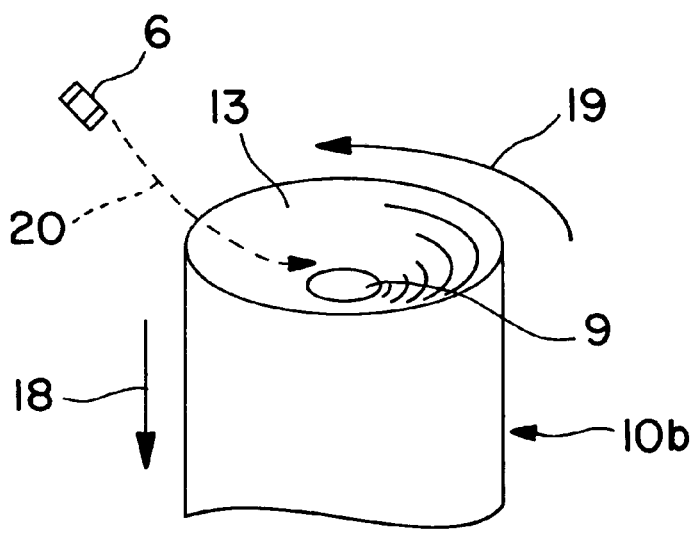
FIG. 2 is a perspective view illustrating a principal part of an aligning path forming member 10b formed in a feeder for feeding electronic chip components according to a second embodiment of the present invention.

FIG. 2 is a schematic representation corresponding to FIG. 1 showing a second embodiment of the present invention. In FIG. 2, duplicated description is omitted of like elements to those previously discussed with respect to FIG. 1. Like elements are assigned like reference numerals.

Referring to FIG. 2, an aligning path forming member 10b is driven so as to be rotated around its axis direction as shown by an arrow 19 when withdrawing from the hopper 7 in the direction as shown by an arrow 18. In this embodiment, since the aligning path forming member 10b is rotated along with its reciprocating movement, more effective agitation can also act on electronic chip components 6 so as to smoothly guide them into the aligning path 9 in the direction of a broken-line arrow 20. In this embodiment, this movement is especially effective for releasing electronic chip components 6 in a cluster located in the peripheral direction of the aligning path forming member 10b.

As described above, in the first embodiment, the aligning path forming member 10a rotates when it protrudes (e.g., when it is advanced in the direction of arrow 16), while in the second embodiment, the aligning path forming member 10*b* rotates when it withdraws (e.g., when it is drawn in the direction of arrow 18). The aligning path forming member may be rotated in both of the protruding and withdrawing directions The direction of rotation can be arbitrarily selected.

It is preferable that the aligning path forming member be rotated at least during part of the reciprocation of the aligning path forming member, as in the above-mentioned first and second embodiments, and that the reciprocating and rotating movements are tied (e g., coupled). For this connected movement, a configuration shown in FIG. 3 may be adopted.

Figure 3:
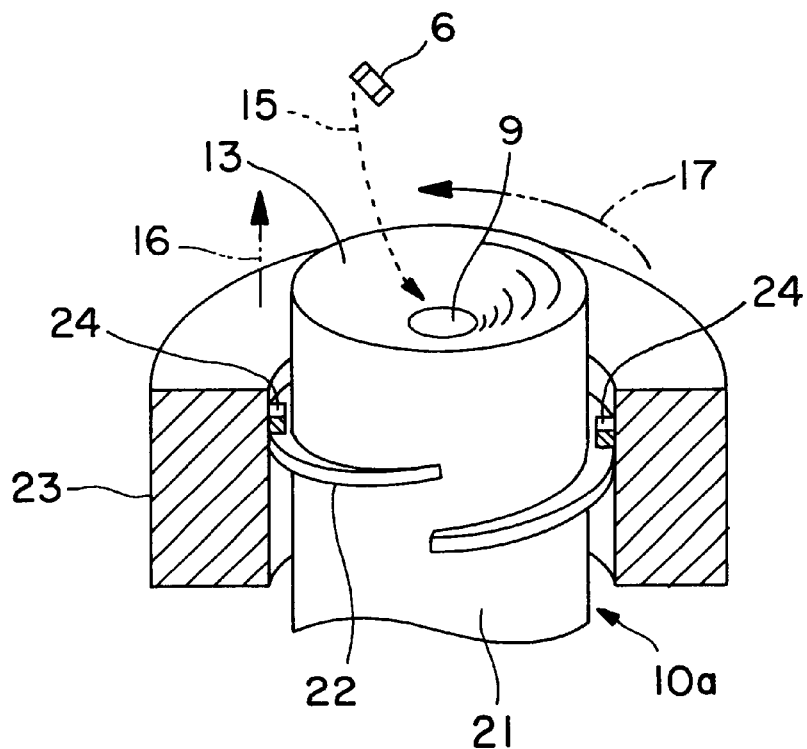
FIG. 3 is a perspective view illustrating an example of an engaging mechanism which rotates a reciprocating aligning path forming member 10a shown in FIG. 1.

FIG. 3 shows a mechanism for rotating the aligning path forming member 10*a* in the first embodiment shown in FIG. 1 by coupling the aligning path forming member 10*a* with a fixed ring 23. In FIG. 3, a description of the previously discussed elements is omitted.

Referring to FIG. 3, a guiding rib 22 which extends in a spiral is formed on a peripheral cylindrical-shaped surface 21 of the aligning path forming member 10*a*, so that this rib protrudes from the surface. Further, the fixed ring 23 is disposed around the aligning path forming member 10*a* having engaging pieces 24 which protrude toward the aligning path forming member 10*a* from the inner periphery of the fixed ring 23. The engaging pieces 24 are placed so as to engage the upper surface of the guiding rib 22. A screw-type advancement mechanism is thereby formed.

In this configuration, when the aligning path forming member 10*a* protrudes in the direction of the arrow 16, a driving force causing rotation in the direction of the arrow 17 acts on the aligning path forming member 10*a*. This causes engagement of the engaging pieces 24 with the spirally extending guiding rib 22, which, in turn, causes the aligning path forming member 10*a* to rotate in the direction of the arrow 17.

In the engaging mechanism shown in FIG. 3, if the guiding rib 22 and the engaging pieces 24 are turned upsidedown (e.g., if the positions of the guiding rib 22 and the engaging pieces 24 are reversed), as in the second embodiment shown in FIG. 2, the aligning path forming member 10*b* can be driven to rotate in the direction of the arrow 19.

The guiding rib 22 can be sandwiched between engaging pieces 24 or a guiding groove can be formed instead of the guiding rib 22 which mates with the engaging pieces 24. In this configuration, the aligning path forming member 10*a* can be rotated to provide both the protruding and withdrawing movements of the aligning path forming member. In this case, the rotating directions of the aligning path forming member when protruding and when withdrawing are opposite to each other.

The rotating angle of the aligning path forming member 10*a* or 10*b* is selected from, for example, approximately ⅛ to 5 revolutions/stroke, and is typically set to approximately ½ revolutions/stroke.

In the aforementioned first and second embodiments, in order to give more effective agitation to electronic chip components 6 by the rotation of the aligning path forming member 10*a* or 10*b*, it is preferable that the surface which contacts the electronic chip components 6, such as the face 13, has a high frictional coefficient. To give a high frictional coefficient, the face 13 of the aligning path forming member 10*a* or 10*b*, for example, may be coated with a resin having a high frictional coefficient. In addition, configurations shown below in FIGS. 4 and 5 may be adopted.

Figure 4:
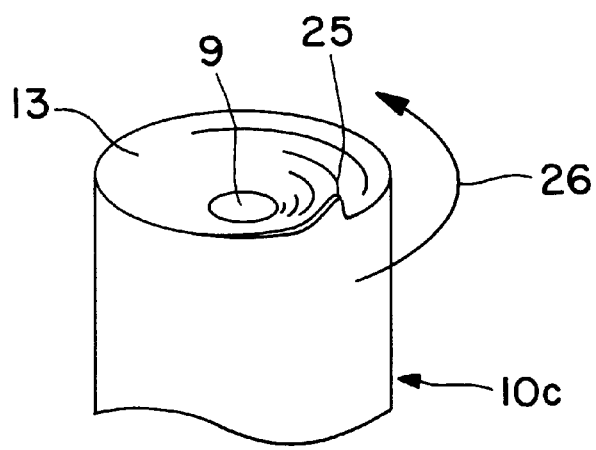
FIG. 4 is a perspective view illustrating a principal part of an aligning path forming member 10c formed in a feeder for electronic chip components according to a third embodiment of the present invention.
Figure 5:
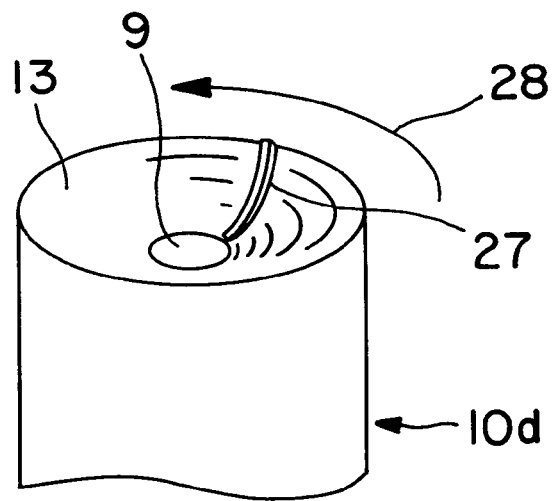
FIG. 5 is a perspective view illustrating a principal part of an aligning path forming member 10d formed in a feeder for electronic chip components according to a fourth embodiment of the present invention.

FIGS. 4 and 5 are drawings corresponding to FIG. 1 showing third and fourth embodiments of the present invention, respectively. In FIGS. 4 and 5, duplicated description is omitted wherein like elements are given like reference numerals of FIG. 1.

With reference to FIG. 4, at least one protrusion 25 is formed on the end face 13 of an aligning path forming member 10*c* located within the hopper 7 (see FIGS. 6 and 7). The size of the protrusion 25 may be small enough for electronic chip components (not shown) to get snagged thereon when the aligning path forming member 10*c* rotates in the direction of an arrow 26. It is preferable that the outer surface of the protrusion 25 be formed in a shape having a curved surface to minimize damage to the electronic chip components. More than one protrusion can be used.

In the embodiment shown in FIG. 5, at least one guide vane 27 is formed on the end face 13 of the aligning path forming member 10*d*, located within the hopper 7. The projection height of the guide vane 27 may also be small enough for electronic chip components (not shown) to get snagged thereon when the aligning path forming member 10*d* rotates in the direction of an arrow 28. It is preferable that the surface of the guide vane 27 be formed in the shape of a curve in the radial direction of the aligning path forming member 10*d* (e.g., the guide vane 27 is curved when viewed looking straight down at the end face 13). The curving direction is designed such that electronic chip components on the end face 13 can be easily guided along the guide vane 27 to the aligning path 9, when the guide vane 27 rotates in the direction of the arrow 28 to catch the electronic chip components. More than one guide vane can be used.

While the present invention has been described with respect to the embodiments shown in the drawings, the invention is intended to cover various modifications within the scope of the invention.

For example, although each of the aligning path forming members 10*a*, 10*b*, 10*c*, and 10*d* according to the embodiments shown in the drawings has the fixed pipe 12 shown in FIG. 7 in the aligning path 9 to guide electronic chip components 6 through the fixed pipe 12 in an aligned state, the fixed pipe 12 can be omitted so that electronic chip components 6 are guided directly through the aligning path 9 in an aligned state.

As described above, according to the present invention, since the aligning path forming member (forming a tubular aligning path which receives electronic chip components which are to be discharged from the discharge opening of the hopper in an aligned state) is driven so as to rotate around its axis and reciprocate as well, stronger agitation movement can be applied to the electronic chip components. This results in smooth movement of electronic chip components guided to the aligning path such that the electronic chip components can be reliably received into the aligning path. This reduces the probability of undesired interruption in the feeding of electronic chip components.

Since the rotation of the aligning path forming member is effective in agitating the components as described above, the stroke of the aligning path forming member can be reduced while still maintaining the desired agitation effect.

According to one experiment, the stroke of the reciprocating movement of the aligning path forming member was set at 12 mm. In this case, the guiding capacity for guiding electronic chip components into the aligning path, i.e., an average number of electronic chip components guided into the aligning path per one reciprocating cycle of the aligning path forming member, increased from 1.8 units to 2 units by adding the rotation to the agitation movement. When the stroke was reduced to 5 mm, although the guiding capacity was reduced, the guiding capacity held steady at 1.8 units by adding the rotation to the agitation movement.

Since the stroke of the aligning path forming member can be reduced in this way, the impact on the electronic chip components can be reduced to control quality degradation causing damage to the electronic chip components. The speed of the reciprocating movement does not necessary have to increase. Thus, no substantial additional load is imposed on the mechanism for driving the reciprocating movement. This reduces the risk that the mechanism for driving will fail, which extends its life and reduces the costs for maintenance. If the stroke of the aligning path forming member is reduced, even when a small number of electronic chip components remain in the hopper, the electronic chip components can be prevented from jumping, so that these components are smoothly guided so as to enter into the aligning path.

According to the present invention, if the fixed pipe for guiding electronic chip components in an aligned state is further disposed in the aligning path of the aligning path forming member, a feeder for feeding electronic chip components suitable for feeding smaller sized components can be provided.

According to the present invention, the aligning path forming member can be coupled to a fixed ring such that its rotation will also result in the desired reciprocation movement. This simplifies the driving mechanism compared with driving the rotation and reciprocation on an individual basis. In this case, the rotation is carried out with the reciprocating movement, simultaneously, to achieve a synergistic effect between the agitation caused by the reciprocation and the agitation by the rotation.

According to the present invention, if the inverse conical-shaped concave surface is formed on the end face of the aligning path forming member located within the hopper, electronic chip components can be effectively guided into the aligning path along the inverse conical-shaped concave surface.

According to the present invention, if a protrusion is formed on the end face of the aligning path forming member within the hopper, the rotation of the aligning path forming member is reliably transmitted to the electronic chip components. Consequently, the agitation movement due to the rotation can be reliably applied to the electronic chip components.

According to the present invention, if a guide vane is formed on the end face of the aligning path forming member within the hopper, the rotation of the aligning path forming member is reliably transmitted to the electronic chip components as in the case of the above-mentioned protrusion. Consequently, the agitation movement due to the rotation can be applied more reliably to the electronic chip components. If the surface of the guide vane is curved and the curving direction is designed such that electronic chip components are guided along the guide vane to the aligning path during rotation, the electronic chip components can be further effectively guided into the aligning path.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A feeder for feeding electronic chip components, comprising:
    a hopper for accommodating a plurality of electronic chip components, having a discharge opening in a bottom portion thereof;
    an aligning path forming member placed in the discharge opening forming a tubular aligning path which receives the electronic chip components when aligned in a predetermined direction, the aligning path forming member being coupled to the feeder such that it can be both rotated around its axis and reciprocated along its axis to agitate the electronic chip components so that the electronic chip components enter said tubular aligning path;
    wherein said aligning path forming member has a concave end face which contacts the electrical chip components; and
    a protrusion formed on said end face for engaging said electronic chip components to increase the agitation applied to said electronic chip components.

2. A feeder according to claim 1, further comprising:
    a conveying path for conveying the electronic chip components which have passed through said aligning path forming member in an aligned state.

3. A feeder according to claim 2, further comprising:
    a dispensing mechanism for dispensing electronic chip components from an end portion of said conveying path.

4. A feeder according to claim 1, further comprising a pipe for guiding electronic chip components in an aligned state disposed within said tubular aligning path in said aligning path forming member.

5. A feeder according to claim 1, wherein said aligning path forming member is coupled to said feeder such that rotation about its axis is linked to reciprocation along its axis.

6. A feeder according to claim 5, wherein said aligning path forming member is mechanically coupled to said feeder using a screw-type mechanism, such that rotation of said aligning path forming member advances said aligning path forming member along the axis of said aligning path forming member.

7. A feeder according to claim 6, wherein said screw-type mechanism comprises a spiral rib formed on an outer surface of said aligning path forming member which mates with an engaging piece which is coupled to the feeder.

8. A feeder according to claim 7, further comprising a plurality of engaging pieces which mate with said spiral rib, said plurality of engaging pieces being coupled to a ring which is formed around said aligning path forming member.

9. A feeder according to claim 1, further comprising a guide vane formed on said end face for engaging said electronic chip components to increase the agitation applied to said electronic chip components.

10. A feeder according to claim 1, wherein said end face has an inverse-conical surface.

11. A feeder according to claim 1, wherein said end face is modified to produce a high-friction surface for engagement with the electronic chip components.

12. A feeder according to claim 9, wherein said guide vane is curved in the radial direction of said aligning path forming member.

13. A feeder for feeding electronic chip components, comprising:
    a hopper for accommodating a plurality of electronic chip components, having a discharge opening in a bottom portion thereof;

an aligning path forming member placed in the discharge opening forming a tubular aligning path which receives the electronic chip components when aligned in a predetermined direction;

a driving mechanism for driving said aligning path forming member so that it is simultaneously rotated around its axis and displaced along its axis;

wherein said aligning path forming member has a concave end face which contacts the electrical chip components; and a guide vane formed on said end face for engaging said electronic chip components to increase the agitation applied to said electronic chip components.

14. A feeding mechanism according to claim 13, wherein said driving mechanism rotates said aligning path forming member while said aligning path forming member is advanced into said hopper.

15. A feeding mechanism according to claim 13, wherein said driving mechanism rotates said aligning path forming member while said aligning path forming member is withdrawn from said hopper.

16. A feeding mechanism according to claim 13, wherein said driving mechanism rotates said aligning path forming member both while said aligning path forming member is advanced into said hopper and withdrawn from said hopper.

17. The feeding mechanism according to claim 13, wherein said aligning path forming member is coupled to said feeder in such a manner that rotation of said aligning path forming member translates into simultaneous axial displacement of said aligning path forming member.

18. A feeder according to claim 11, wherein said aligning path forming member has a concave end face which contacts the electrical chip components.

19. A feeder according to claim 18, further comprising a protrusion formed on said end face for engaging said electronic chip components to increase the agitation applied to said electronic chip components.

20. A feeder according to claim 18, further comprising a guide vane formed on said end face for engaging said electronic chip components to increase the agitation applied to said electronic chip components.

21. A feeder for feeding electronic chip components, comprising:

a hopper for accommodating a plurality of electronic chip components, having a discharge opening in a bottom portion thereof;

an aligning path forming member placed in the discharge opening forming a tubular aligning path which receives the electronic chip components when aligned in a predetermined direction, the aligning path forming member being coupled to the feeder such that it can be both continuously rotated around its axis and reciprocated along its axis to agitate the electronic chip components so that the electronic chip components enter said tubular aligning path; and wherein said aligning path forming member can be continuously rotated in the same direction while being reciprocated in both directions along its axis.

* * * * *